United States Patent
Zhang et al.

(10) Patent No.: US 10,718,797 B2
(45) Date of Patent: Jul. 21, 2020

(54) CURRENT DETECTING APPARATUS AND BATTERY MANAGEMENT SYSTEM

(71) Applicant: Contemporary Amperex Technology Co., Limited, Ningde, Fujian (CN)

(72) Inventors: Wei Zhang, Ningde (CN); Zhimin Dan, Ningde (CN); Jiechao Luo, Ningde (CN); Yizhen Hou, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 77 days.

(21) Appl. No.: 16/165,925

(22) Filed: Oct. 19, 2018

(65) Prior Publication Data

US 2019/0120880 A1 Apr. 25, 2019

(30) Foreign Application Priority Data

Oct. 23, 2017 (CN) .......................... 2017 1 0993390

(51) Int. Cl.
*G01R 19/165* (2006.01)
*B60L 58/10* (2019.01)
(Continued)

(52) U.S. Cl.
CPC ........ *G01R 19/16542* (2013.01); *B60L 58/10* (2019.02); *G01R 19/10* (2013.01);
(Continued)

(58) Field of Classification Search
USPC ....................................................... 320/134
See application file for complete search history.

(56) References Cited

U.S. PATENT DOCUMENTS

2002/0149345 A1* 10/2002 Takano ................. H02J 7/0068
320/137
2007/0268000 A1* 11/2007 Kobayashi ............ H02J 7/0019
320/118
(Continued)

FOREIGN PATENT DOCUMENTS

CN       101567575 A      10/2009
CN       201383674 Y       1/2010
(Continued)

OTHER PUBLICATIONS

First Official Action and Search Report for Chinese Application No. 201710993390.0, dated Aug. 1, 2019, 10 pages.
(Continued)

*Primary Examiner* — Mohammed Alam
(74) *Attorney, Agent, or Firm* — Law Offices of Liaoteng Wang

(57) ABSTRACT

A current detecting apparatus and a battery management system are provided. In the current detecting apparatus, a positive electrode of a power battery pack is connected to a first terminal of a primary positive circuit, a negative electrode of the power battery pack is connected to a first terminal of a primary negative circuit, and a current sensor is connected in series between the negative electrode of the power battery pack and the first terminal of the primary negative circuit; the current sensor is configured for obtaining and outputting a voltage signal of the power battery pack; a microcontroller unit is configured for implementing current conversion on the voltage signal, transmitting a detected current value, which is obtained by the current conversion, of the power battery pack and receiving a control command for controlling the primary positive and negative circuits to turn on or turn off.

11 Claims, 4 Drawing Sheets

(51) Int. Cl.
*G01R 31/382* (2019.01)
*G01R 19/10* (2006.01)
*G01R 31/36* (2020.01)
*H02J 7/00* (2006.01)

(52) U.S. Cl.
CPC ....... *G01R 31/3648* (2013.01); *G01R 31/382* (2019.01); *H02J 7/008* (2013.01); *B60L 2240/549* (2013.01); *Y02T 10/7005* (2013.01)

(56) References Cited

U.S. PATENT DOCUMENTS

| | | | | |
|---|---|---|---|---|
| 2010/0270973 | A1* | 10/2010 | Miyazaki | H01M 10/443 320/120 |
| 2016/0093921 | A1* | 3/2016 | Kadirvel | H02J 7/00 320/112 |
| 2019/0120880 | A1* | 4/2019 | Zhang | G01R 31/382 |

FOREIGN PATENT DOCUMENTS

| | | |
|---|---|---|
| CN | 102044718 A | 5/2011 |
| CN | 103229060 A | 7/2013 |
| CN | 103618353 A | 3/2014 |
| CN | 104112876 A | 10/2014 |
| CN | 104953555 A | 9/2015 |
| CN | 204855638 U | 12/2015 |
| CN | 104024871 B | 8/2016 |
| CN | 206099317 U | 4/2017 |
| CN | 106712174 A | 5/2017 |
| CN | 206195336 U | 5/2017 |
| DE | 102014202626 A1 | 8/2015 |
| DE | 102015002148 A1 | 8/2016 |
| EP | 2793308 A1 | 10/2014 |

OTHER PUBLICATIONS

Huiyan Chen et al., "Vehicle Information Technology", published by Beijing Institute of Technology Press on Dec. 31, 2013, pp. 45-49.

Huaying Zhou et al., "Structure and Principle of Battery Electric Vehicle", published by Beijing Institute of Technology Press on Aug. 31, 2016, p. 38.

The extended European search report dated Apr. 2, 2019 for European Application No. 18201325.0, 7 pages.

Second Office Action and supplemental search report for Chinese Application No. 201710993390.0, dated Mar. 17, 2020, 10 pages.

* cited by examiner

CURRENT DETECTING APPARATUS AND BATTERY MANAGEMENT SYSTEM

CROSS-REFERENCE TO RELATED APPLICATION

This application claims priority to Chinese Patent Application No. 201710993390.0, filed on Oct. 23, 2017, which is hereby incorporated by reference in its entirety.

TECHNICAL FIELD

The present disclosure relates to a field of power battery, and more particularly, to a current detecting apparatus and a battery management system.

BACKGROUND

It is a trend in automobile industry to replace fuel vehicles by electric vehicles. However, safety of on-board battery packs has become one of problems hindering spreading of the electric vehicles.

Now, in order to reduce risks when an on-board battery pack is supplying electricity for an electric vehicle and satisfy function requirements of the electric vehicle, it is necessary to detect a current of the on-board battery pack and control a primary positive circuit and a primary negative circuit of the on-board battery pack.

Generally, the primary positive circuit and the primary negative circuit are specially designed external of a traditional battery management system, which cooperates with a current sensor or a current detecting unit to detect the current of the on-board battery pack, so the circuit structure is complex and the cost is high.

SUMMARY

Embodiments of the present disclosure provide a current detecting apparatus and a battery management system, in which a primary positive circuit and a primary negative circuit are integrated in the circuit detecting apparatus, so the circuit structure is simple and has a high integrity.

According to an aspect of embodiments of the present disclosure, there is provided a current detecting apparatus comprising a current sensor, a microcontroller unit, a primary positive circuit and a primary negative circuit, wherein: a positive electrode of a power battery pack to be tested is connected to a first terminal of the primary positive circuit, a negative electrode of the power battery pack is connected to a first terminal of the primary negative circuit, and the current sensor is connected in series between the negative electrode of the power battery pack and the first terminal of the primary negative circuit; the current sensor is configured for obtaining and outputting a voltage signal of the power battery pack; the microcontroller unit is configured for collecting the voltage signal output from a signal terminal of the current sensor, implementing current conversion on the voltage signal, transmitting a detected current value, which is obtained by the current conversion, of the power battery pack and receiving a control command for controlling the primary positive circuit and the primary negative circuit to turn on or turn off.

According to a second aspect of embodiments of the present disclosure, there is provided a battery management system comprising the current detecting apparatus and a battery management unit connected to the current detecting apparatus, wherein the battery management unit is configured to: receive the detected current value, which is forwarded by the current detecting apparatus, of the power battery pack; when the positive end MOS transistor unit and the negative end MOS transistor unit in the current detecting apparatus are in a turn-on state, control the positive end MOS transistor unit and the negative end MOS transistor unit to turn off or turn on based on a preset maximum supply current value of the power battery pack and the detected current value.

BRIEF DESCRIPTION OF THE DRAWINGS

In order to illustrate technical solutions of embodiments of the present disclosure clearer, the accompanying drawings required to illustrate the embodiments of the present disclosure are briefly introduced below. Those ordinary skilled in the art would also obtain other accompany drawings based on the following accompany drawings without creative works.

DETAILED DESCRIPTION

Features and exemplary embodiments of various aspects of the present disclosure will be described in detail below. In order to make intents, technical solutions and advantages of the present disclosure clearer, the present disclosure will be described in detail below in conjunction with the accompany drawings and embodiments. It should be appreciated that the specific embodiments described herein are construed merely for illustrating, rather than limiting, the present disclosure. For those ordinary skilled in the art, the present disclosure may be practiced without some of the specific details. The following description of embodiments is merely for providing better understanding of the present disclosure by illustrating examples of the present disclosure.

It is to be noted that relationship terms such as "first" and "second" and so on are used to distinguish an entity or operation from another entity or operation, and it is not necessary to require or suggest that there is any actual relationship or sequence between these entities or operations. Moreover, terms such as "including", "containing" or any other variant are intended to cover non-exclusive inclusion, such that a process, method, article or device including a series of elements includes not only theses elements but also other elements that are not explicitly listed or inherently exist in the process, method, article or device. Other equivalent elements are not excluded in the process, method, article or device including the elements defined by the term "including".

In order to better understand the present disclosure, a current detecting apparatus and a battery management system according to embodiments of the present disclosure will be described in detail in conjunction with the accompany drawings. It should be noted that the embodiments are not used to limit the scopes of the present disclosure.

Figure 1:
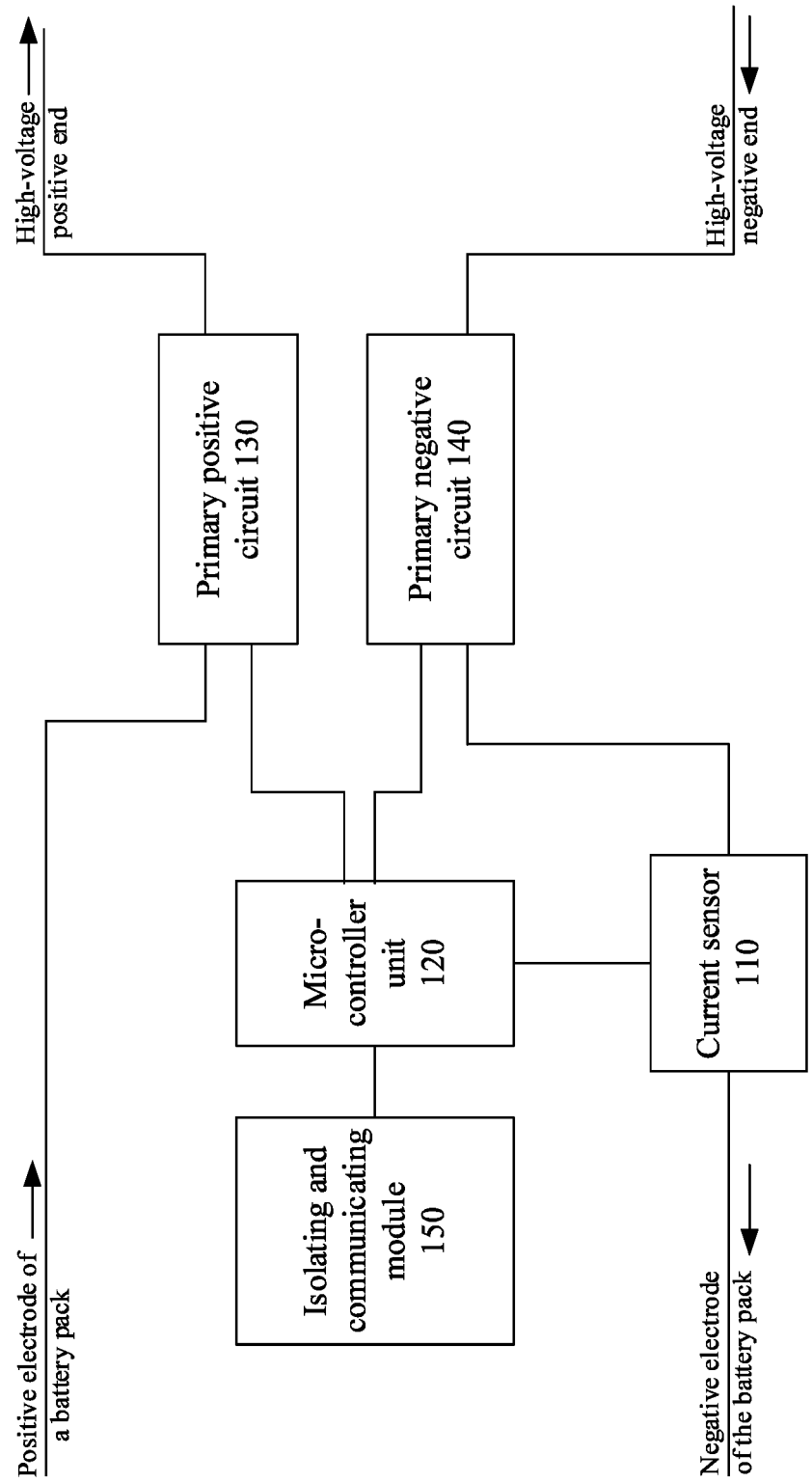
FIG. 1 is a structure diagram of a current detecting apparatus according to an embodiment of the present disclosure.

FIG. 1 is a structure diagram of a current detecting apparatus according to an embodiment of the present disclosure. As shown in FIG. 1, the current detecting apparatus 100 includes a current sensor 110, a microcontroller unit 120, a primary positive circuit 130 and a primary negative circuit 140. The primary positive circuit 130 includes a positive end MOS transistor unit 131 and the primary negative circuit 140 includes a negative end MOS transistor unit 141. A positive electrode of a power battery pack to be tested is connected to a first terminal of the primary positive circuit 130, a negative electrode of the power battery pack is connected to a first terminal of the primary negative circuit 140, and the current sensor 110 is connected in series between the negative electrode of the power battery pack and the first terminal of the primary negative circuit.

The current sensor 110 is configured for obtaining and outputting a voltage signal of the power battery pack.

The microcontroller unit 120 is configured for collecting the voltage signal output from a signal terminal of the current sensor 110, implementing current conversion on the voltage signal, transmitting a detected current value, which is obtained by the current conversion, of the power battery pack, and receiving a control command for controlling the primary positive circuit and the primary negative circuit to turn on or turn off.

Continue referring to FIG. 1, in an embodiment, a second terminal of the primary positive circuit may be connected to a positive end of an external load and a second terminal of the primary negative circuit may be connected to a negative end of the external load. The external load may be for example, an electric vehicle, the power battery pack supplies electricity for which to satisfy automobile function requirements of a user.

In embodiments of the present disclosure, it is unnecessary to specially provide the primary positive circuit and the primary negative circuit outside of the current detecting apparatus. On contrary, the primary positive circuit and the primary negative circuit may be integrated in the current detecting apparatus, so that problems that the circuit structure is complex and the cost is high due to specially providing the primary positive circuit and the primary negative circuit outside of the current detecting apparatus may be solved. In this way, the length of a wire harness within the electric vehicle may be shortened, and energy consumption on the wire harness may be reduced when the power battery pack is supplying electricity for the electric vehicle. Meanwhile, the circuit structure is simplified and the cost is reduced.

Figure 2:
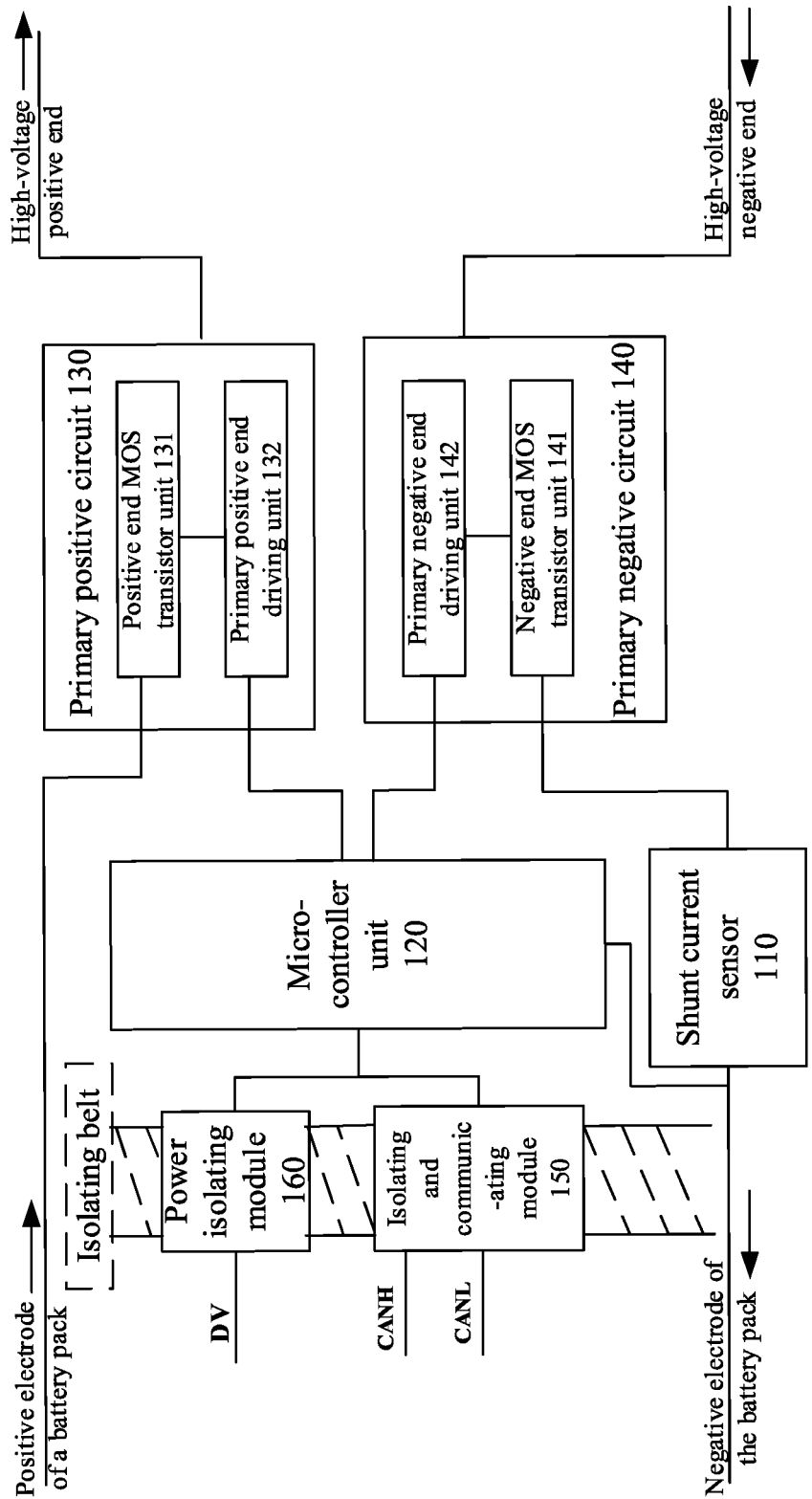
FIG. 2 is a structure diagram of a current detecting apparatus according to another embodiment of the present disclosure.

FIG. 2 is a structure diagram of a current detecting apparatus according to another embodiment of the present disclosure. Similar or equivalent components in FIG. 2 are referenced by same reference numbers as FIG. 1.

As shown in FIG. 2, in an embodiment, the current detecting apparatus 200 may further include an isolating and communicating module 150 for electrically isolating the current sensor, the microcontroller unit, the primary positive circuit and the primary negative circuit, receiving and forwarding the detected current value of the power battery pack and receiving and forwarding the control command.

In an embodiment, the current detecting apparatus 200 may be connected to a battery management unit (BMU) via the isolating and communicating module 150. Specifically, the isolating and communicating module 150 may receive the detected current value, which is transmitted from the microcontroller unit 120, of the power battery pack, forward the detected current value of the power battery pack to the BMU for processing, receive the control command transmitted from the BMU and forward the received control command to the microcontroller unit.

Continue referring to FIG. 2, in an embodiment, the current detecting apparatus 200 may further include a power isolating module 160 for electrically isolating an input power supply and converting a voltage supplied by the electrically isolated power supply to voltages required by respective modules in the current detecting apparatus 200.

In an embodiment, the power isolating module 160 may be connected to the BMU via a power supply interface. The BMU outputs a low-voltage direct-current power supply (DV) to the power isolating module 160 via the power supply interface, wherein a side, on which the BMU is located, of the power supply interface is referred as a low-voltage side of a current detecting system. Usually, the primary positive circuit and the primary negative circuit of the current detecting apparatus are connected to a load in a power system and a side, on which the current detecting apparatus is located, of the power supply interface is referred as a high-voltage side of the current detecting system.

In order to avoid interference signals from the low-voltage side and the high-voltage side so as to enable the current detecting system to normally operate, it is necessary to electrically isolate the low-voltage side and the high-voltage side.

In an embodiment of the present disclosure, as both the isolating and communicating module 150 and the power isolating module 160 are capable of electrically isolating the low-voltage side and the high-voltage side, the isolating and communicating module 150 and the power isolating module 160 form an isolating belt for isolating the low-voltage side and the high-voltage side of the current detecting system.

The current detecting apparatus according to embodiments of the present disclosure includes the primary positive circuit and the primary negative circuit to satisfy the automobile function requirements, so the circuit structure is simple and has a high integrity.

In prior art, it is usual to control a relay coil to turn on or turn off by employing a relay in combination with a driving unit so as to control a primary positive relay to turn on or turn off. However, the relay usually has a short service life and a long response time, and the relay and the power battery pack are prone to damage; in view of material characteristics of the relay, in order to avoid mis-energization of the primary circuits of the power battery pack due to adhesion of the relay, it is usually required to provide a fuse unit at the positive electrode and the negative electrode of the power battery pack, so the circuit structure is very complex.

For the above reasons, in the current detecting apparatus according to embodiments of the present disclosure, the relay may be replaced by a MOS transistor to control the primary circuits of the power battery pack to turn on or turn off. A current detecting apparatus according to another embodiment of the present disclosure will be described in detail below in conjunction with the accompany drawings.

Continue referring to FIG. 2, in an embodiment, the primary positive circuit 130 includes a positive end MOS transistor unit 131 and the primary negative circuit 140 includes a negative end MOS transistor unit 141.

In an embodiment of the present disclosure, the current detecting apparatus 200 may control the primary positive circuit 130 to turn on or turn off by controlling the positive end MOS transistor unit 131 to turn on or turn off, and control the primary negative circuit 140 to turn on or turn off by controlling the negative end MOS transistor unit 141 to turn on or turn off.

In an embodiment of the present disclosure, the primary positive circuit and the primary negative circuit may be controlled to turn on or turn off by controlling the MOS transistors to turn on or turn off. As the MOS transistors have a long service life and a short response time and are not prone to damage, it is unnecessary to provide a separate protection circuit and the circuit structure is simplified.

In an embodiment, the current sensor is a shunt current sensor or a hall current sensor.

As an example, when the current sensor is the shunt current sensor, the isolating and communicating module 150 may communicate via a highly reliable controller area network (CAN).

As another example, when the current sensor is the hall current sensor, the isolating and communicating module 150 may amplify a current signal measured by a magnetic field sensitive element with a measuring and amplifying circuit and output the amplified current signal in a form of analog signal via an analog interface.

A circuit structure diagram of a current detecting apparatus according to another embodiment of the present disclosure will be described in detail by taking the shunt current sensor as the current sensor as an example.

Figure 3:
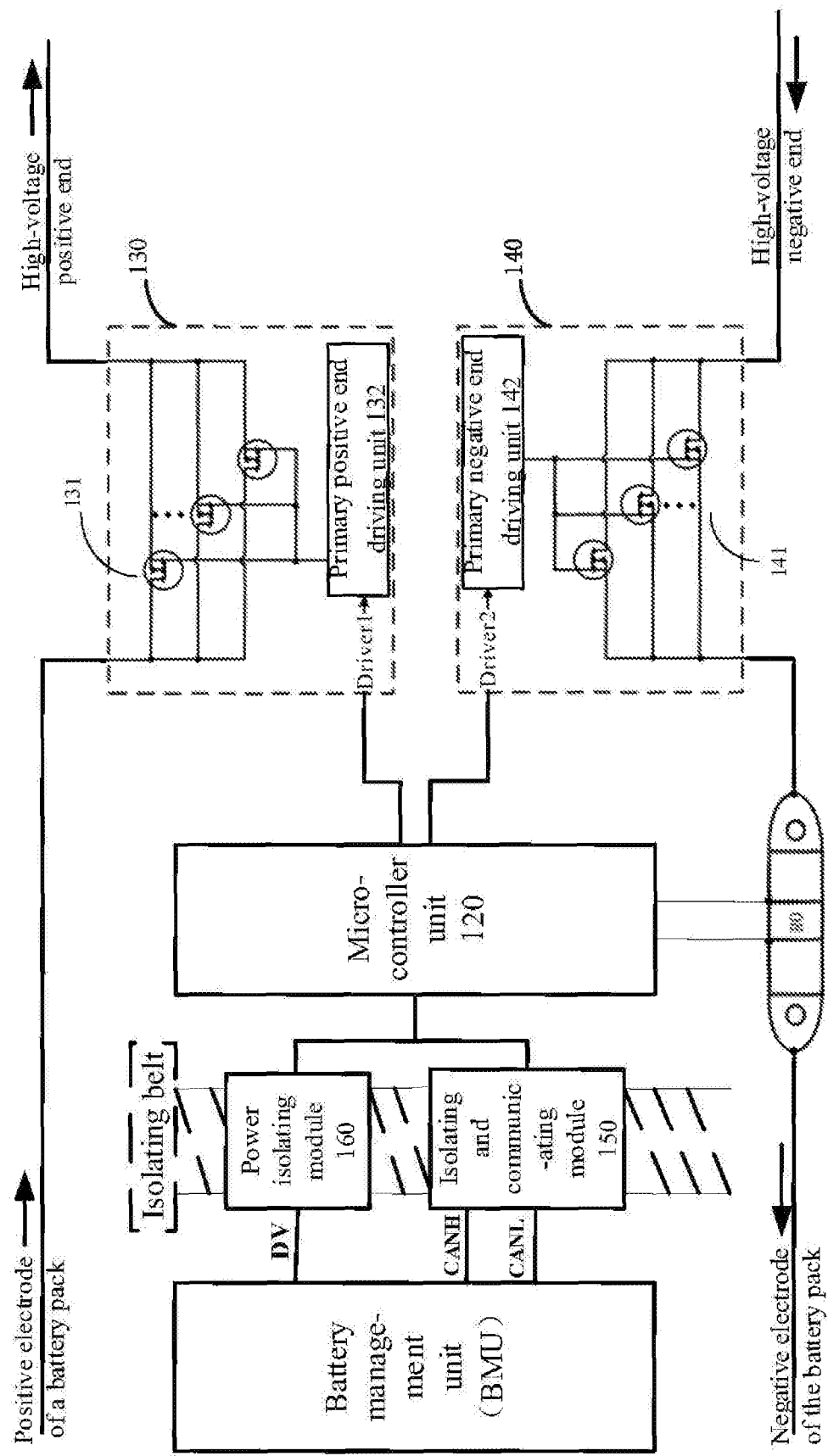
FIG. 3 is a circuit structure diagram of a current detecting apparatus according to another embodiment of the present disclosure.

FIG. 3 illustrates a circuit structure diagram of the current detecting apparatus according to another embodiment of the present disclosure.

As shown in FIG. 3, the isolating and CAN communicating module 150 may convert the detected current value of the power battery pack to current data meeting CAN specifications and transmit the current data meeting CAN specifications to a CAN communicating interface via a CAN bus. The CAN communicating interface includes a CAN high-voltage line interface CANH and a CAN low-voltage line interface CANL. The CAN communicating interface 141 may output the current data on the CAN bus by means of differential signal transmission via the CANH and CANL.

As the CANH may be at a high-voltage or suspended state and the CANL may be at a low-voltage or suspended state, the CANH and the CANL may produce a differential voltage on two buses. By transmitting the current value collected by the shunt current sensor via the two buses having the differential voltage, short-circuit may be effectively avoided and interferences from external signals may be prevented.

In an example, the shunt current circuit may implement a full-range and accurate current measurement and communicate with the BMU via the CAN bus, wherein the communication between the shunt current circuit and the BMU has a high transmission rate and a robust interference immunity.

In prior art, when the primary positive circuit and the primary negative circuit of the power battery pack are controlled to turn on or turn off by the relay, the relay is controlled by high-low voltage driving. In order to avoid mis-energization of the primary circuits of the power battery pack due to adhesion of the relay, it is usual to provide a protection device such as a fuse at the positive electrode and the negative electrode of the power battery pack. However, although the fusing time of the fuse is several milliseconds, a big current flowing through the power battery pack will damage the power battery pack and the load during this period.

Furthermore, the relay has a large volume, a heavy weight, a high cost and a long response time and is prone to external interferences due to coil driving. In addition, the design of the fuse unit makes the circuit structure more complex.

In view of the above defects, the current detecting apparatus according to embodiments of the present disclosure provides a circuit protection strategy in which the primary positive circuit and the primary negative circuit are integrated in the current detecting apparatus and the MOS transistor is controlled to turn on or turn off by detecting the current of the primary circuits, for example, the current of the primary positive circuit or the primary negative circuit. In this way, the fuse unit on the positive and negative electrodes of the power battery pack may be omitted, so that the complexity of the circuit structure is reduced.

Continue referring to FIG. 3, in an embodiment of the present disclosure, the positive end MOS transistor unit 131 includes one or more positive end MOS transistors connected in parallel, wherein a drain electrode of each positive end MOS transistor is connected to the first terminal of the primary positive circuit 130 and a source electrode of each positive end MOS transistor is connected to the second terminal of the primary positive circuit 130.

The primary positive circuit 130 further includes a primary positive end driving unit 132 connected to a gate electrode of each positive end MOS transistor. The primary positive end driving unit 132 is used to control the primary positive circuit 130 to turn on or turn off by controlling the one or more positive end MOS transistors to turn on or turn off under the control of the control command.

Continue referring to FIG. 3, in an embodiment of the present disclosure, a plurality of negative end MOS transistors are connected in parallel, a source electrode of each negative end MOS transistor is connected to the first terminal of the primary negative circuit 140, and a drain electrode of each negative end MOS transistor is connected to the second terminal of the primary negative circuit 140.

The primary negative circuit 140 further includes a primary negative end driving unit 142 connected to a gate electrode of each negative end MOS transistor. The primary negative end driving unit 142 is used to control the primary negative circuit to turn on or turn off by controlling the one or more negative end MOS transistors to turn on or turn off under the control of the control command.

In order to facilitate understanding, characteristic parameters of the MOS transistor and the relay are compared in table 1 below to illustrate advantages of employing the MOS transistor rather than the relay to control a battery circuit.

TABLE 1

| Characteristic parameter | MOS transistor | Relay |
| --- | --- | --- |
| Service life | It has a long service life, requires essentially no maintenance, and does not have any aging problem. | It is easily aging, which leads to adhesion of contacts or oxidation of metal materials. When its service life expires, it must be replaced. |
| Mechanical parameter | It has a small volume and a light weight. | It has a large volume and a heavy weight. |

TABLE 1-continued

| Characteristic parameter | MOS transistor | Relay |
|---|---|---|
| Mechanical vibration | It is not affected by any mechanical vibration. | It may be mis-energized due to a mechanical vibration. |
| Noise | There is substantially no noise when it turns on or turns off. | It makes a sound when it turns on or turns off. |
| Response time | Its turn-on time and turn-off time are usually less than 1 us. | Its turn-on time and turn-off time are usually larger than 100 ms. |
| Protection mechanism | Its response time is short, so it has an effective and reliable disconnection mechanism. | Its response time is long, so the relay and the battery pack are prone to damage. |

As can be seen from Table 1, respective characteristic parameters of the MOS transistor are better than those of the relay; as the MOS transistor has fast (for example, at a millisecond level) and safe conduction and disconnection mechanisms, it is unnecessary to incorporate the fuse unit at the positive and negative electrodes of the battery pack, so the circuit structure is simplified.

Figure 4:
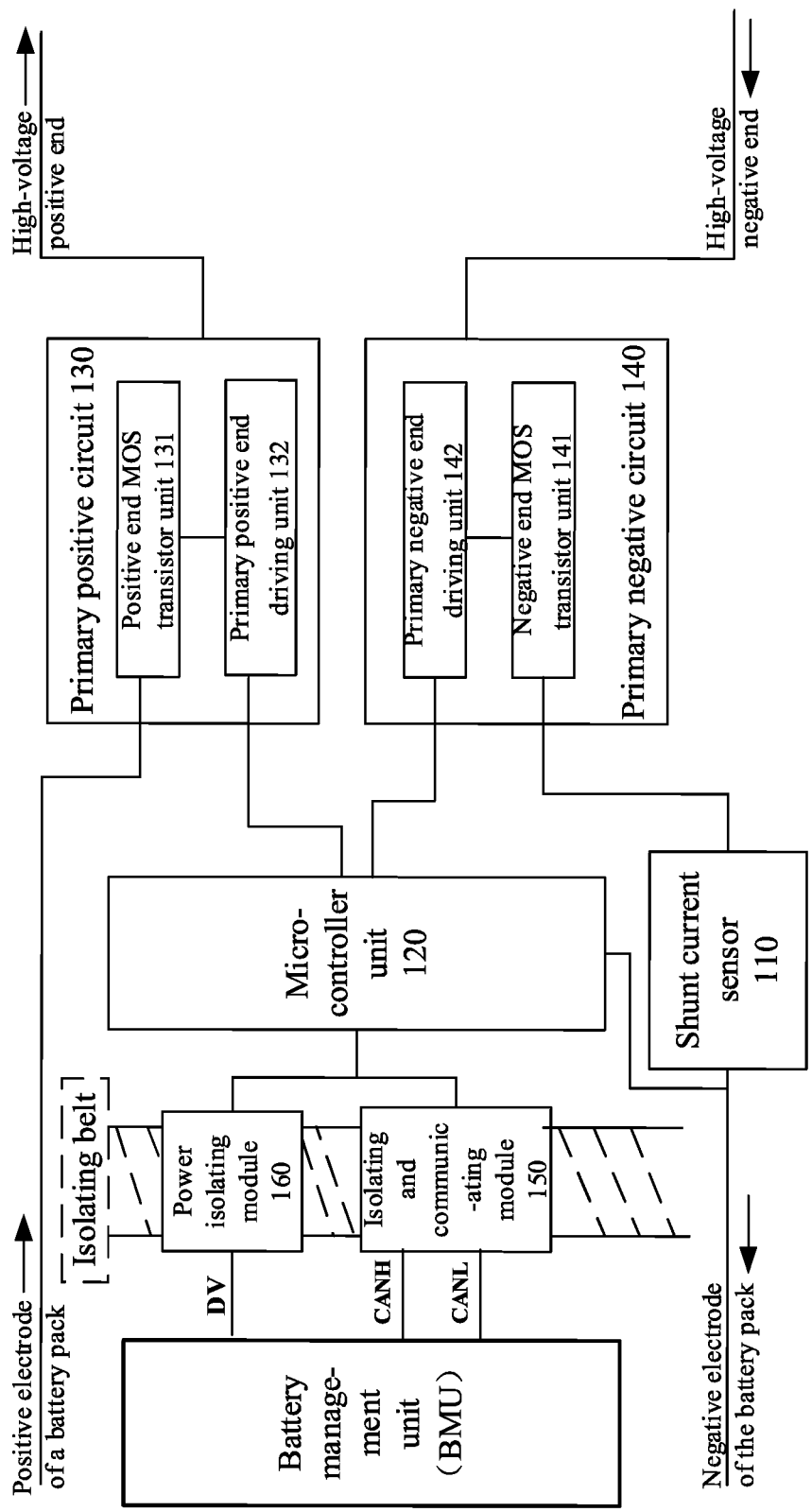
FIG. 4 is a structure diagram of a battery management system according to an embodiment of the present disclosure.

A battery management system according to an embodiment of the present disclosure is described below in conjunction with the accompany drawings. FIG. 4 illustrates a structure diagram of the battery management system according to an embodiment of the present disclosure. Similar or same components in FIG. 4 are referenced by same reference numbers as FIG. 2.

As shown in FIG. 4, the battery management system according to an embodiment of the present disclosure includes the current detecting apparatus 200 as described in the above embodiments and a battery management unit 10 connected to the current detecting apparatus 200.

The battery management unit 10 may further include a connecting unit, wherein the connecting unit may include for example, the power supply interface and the CAN communicating interface; the power supply interface is used to output the low-voltage direct-current power supply; the CAN communicating interface is used to connect the current detecting apparatus and the battery management unit and transmit the detected current value of the power battery pack, a first control command and a second control command.

As can be known from the above embodiments, the battery management unit 10 outputs the low-voltage direct-current power supply to the power isolating module via the power supply interface; the battery management unit 10 communicates with the microcontroller unit 150, receives the detected current value of the power battery pack, and transmits the first and second control commands to the microcontroller unit 150 via the CAN communicating interface.

Continue referring to FIG. 4, the second terminal of the primary positive circuit 130 in the current detecting apparatus 200 is connected to a positive end of an external load module, and the second terminal of the primary negative circuit 140 in the current detecting apparatus 200 is connected to a negative end of the external load module.

In an embodiment of the present disclosure, in the primary positive or negative circuit, the over-current capacity of the MOS transistor is enhanced by connecting the MOS transistors in parallel.

In an embodiment, assuming that a maximum supply current of the battery pack is $I_{max}$, a conduction current of the MOS transistor in the positive end MOS transistor unit is $I_{DS1}$, a conduction current of the MOS transistor in the negative end MOS transistor unit is $I_{DS2}$, the number of MOS transistors in the primary positive circuit is 'n1' and the number of MOS transistors in the primary negative circuit is 'n2', 'n1' and 'n2' may be calculated by the following process.

For the positive end MOS transistor unit, if the maximum supply current of the battery pack $I_{max}$ and the conduction current $I_{DS1}$ of the MOS transistor in the positive end MOS transistor unit satisfy $$a_1 < \frac{I_{max}}{I_{DS1}} < b_1$$

(a1 and b1 are adjacent integers), then the number 'n1' of MOS transistors in the primary positive circuit may be equal to 'b1'. If the cost is not considered or in order to satisfy functional safety requirements, 'n1' may also be an integer larger than 'b1'.

For the negative end MOS transistor unit, if the maximum supply current of the battery pack $I_{max}$ and the conduction current $I_{DS2}$ of the MOS transistor in the negative end MOS transistor unit satisfy $$a_2 < \frac{I_{max}}{I_{DS1}} < b_2$$

(a2 and b2 are adjacent integers), then the number 'n2' of MOS transistors in the primary negative circuit may be equal to 'b2'. If the cost is not considered or in order to satisfy functional safety requirements, 'n2' may also be an integer larger than 'b2'.

In an embodiment, the conduction current of the MOS transistor is related to a model or type of the MOS transistor, and a user may determine the number of MOS transistors in the MOS transistor unit in the primary positive circuit and the number of MOS transistors in the MOS transistor unit in the primary negative circuit according to the maximum supply current of the battery pack and the conduction current of the MOS transistor in combination of actual over-current capability requirements of the MOS transistor units in the current detecting apparatus of embodiments of the present disclosure.

In an embodiment, the battery management unit 10 is configured to, when both the positive end MOS transistor unit 131 and the negative end MOS transistor unit 141 in the current detecting apparatus 200 are in a turn-on state, control the positive end MOS transistor unit 131 and the negative end MOS transistor unit 141 to turn on or turn off according to a preset maximum supply current value of the power battery pack and the detected current value.

As another example, the battery management unit 10 is configured to, when both the positive end MOS transistor unit 131 and the negative end MOS transistor unit 141 in the current detecting apparatus 200 are in the turn-on state, if a difference between the detected current value and the maximum supply current value is larger than a first preset difference threshold, then control both the positive end MOS transistor unit and the negative end MOS transistor unit to turn off; if the detected current value is larger than zero and less than the maximum supply current value, then control both the positive end MOS transistor unit and the negative end MOS transistor unit to turn on.

In this example, the battery management unit 10 is further configured to, when both the positive end MOS transistor unit 131 and the negative end MOS transistor unit 141 in the current detecting apparatus 200 are in the turn-on state, if the detected current value is equal to zero, then determine that the positive end MOS transistor unit 131, the negative end MOS transistor unit 141 or the load module has an open circuit fault.

As another example, the battery management unit 10 is further configured to, when both the positive end MOS transistor unit 131 and the negative end MOS transistor unit 141 in the current detecting apparatus 200 are in a turn-off state, if the detected current value is equal to zero, then determine both the positive end MOS transistor unit 131 and the negative end MOS transistor unit 141 to turn off; if the difference between the detected current value and the maximum supply current value is larger than a second preset difference threshold or the detected current value is larger than zero and less than the maximum supply current value, then determine that the positive end MOS transistor unit 131 or the negative end MOS transistor unit 141 has a short circuit fault.

In an embodiment, the battery management unit 10 is further configured to generate the first control command to control both the positive end MOS transistor unit 131 and the negative end MOS transistor unit 141 to turn off and the second control command to control both the positive end MOS transistor unit 131 and the negative end MOS transistor 141 to turn on.

In an embodiment, the battery management unit 10 is further configured to output an alert signal when determining that the positive end MOS transistor unit has the open or short circuit fault or the negative end MOS transistor unit 141 has the open or short circuit fault.

In order to facilitate understanding, controlling the MOS transistor to turn on or turn off based on the current in the primary circuits according to an embodiment of the present disclosure is described in combination of Table 2 below.

TABLE 2

| What is occurring | Detected circumstance | Determined circumstance |
|---|---|---|
| The positive end MOS transistor unit and the negative end MOS transistor unit are controlled to be in the turn-on state. | $I_0 = 0$ | The positive end MOS transistor unit, the negative end MOS transistor unit or the load has the open circuit fault. |
| | $0 < I_0 < I_{max}$ | The battery pack supplies power normally, an initial state is maintained, and it is prepared for a next detection. |
| | $I_0 \gg I_{max}$ | It is likely that the load has the short circuit fault, and it is necessary to immediately turn off the positive end MOS transistor unit and the negative end MOS transistor unit. |
| The positive end MOS transistor unit and the negative end MOS transistor unit are controlled to be in the turn-off state. | $I_0 = 0$ | The positive end MOS transistor unit has the open circuit fault or the negative end MOS transistor unit is normally operating. |
| | $0 < I_0 < I_{max}$ | The positive end MOS transistor unit and the negative end MOS transistor unit have the short circuit fault. |
| | $I_0 \gg I_{max}$ | The positive end MOS transistor unit and the negative end MOS transistor unit have the short circuit fault. |

In Table 2, $I_0$ represents the detected current value of the power battery pack, $I_{max}$ represents the maximum supply current value of the power battery pack, and $I_0 \gg I_{max}$ represents that the difference between $I_0$ and $I_{max}$ is larger than a preset difference threshold.

In an embodiment, the alert signal is issued timely when the MOS transistor units have a dysfunction, so that various risks and damages caused by faults of the MOS transistor units may be effectively avoided.

In an embodiment, when the power battery pack and the current detecting apparatus operate normally, the primary positive circuit and the primary negative circuit may be integrated into the current detecting apparatus and the turn-on and turn-off states of the primary circuits of the power battery pack may be controlled in real time by connecting the multiple MOS transistors in parallel in combination with relevant software configurations in the battery management unit. So a series of safety problems caused by mis-energization or mis-shutdown of the primary circuits of the power battery pack may be avoided and problems such as complex structure, high cost, and long response time of prior art circuit structure may be solved.

The above embodiments may be implemented entirely or partly by software, hardware, firmware or any combination thereof. When it is implemented by software, it may be entirely or partly implemented as a computer program product or a computer readable storage medium. The computer program product or the computer readable storage medium includes one or more computer instructions. When the computer program instructions are loaded and executed on a computer, they entirely and partly produce the flowchart or functions described in the embodiments of the present disclosure. The computer may be a general purpose computer, a special purpose computer, a computer network, or another programmable apparatus. The computer instructions may be stored in the computer readable storage medium or may be transmitted from a computer readable storage medium to another computer readable storage medium. For example, the computer instructions may be transmitted by wire (for example, coaxial cable, optical fiber, digital subscriber line (DSL)) or wireless (for example, infrared, radio, microwave and so on) from a website, computer, server or data center to another web site, computer, server or data center. The computer readable storage medium may be any applicable medium accessible by the computer or a data storage device such as a server or a data center integrated with one or more applicable media. The applicable medium may be a magnetic medium (for example, a soft disk, a hard disk, a magnetic tape), an optical medium (for example, a DVD) or a semiconductor medium (for example, a solid state disk (SSD)) and so on.

It should be noted that the disclosure is not limited to the specific configurations and processing shown in the figures and described herein. For clarity, detailed description of well known processes is omitted. In the above embodiments, several specific steps are described and illustrated as an example. However, the process of the present disclosure is not limited to the described and illustrated steps. Those skilled in the art may make various changes, modifications and additions or change the order of implementing the steps upon understanding the spirit of the present disclosure.

The above described are specific implementations of the present disclosure. Those skilled in the art would appreciate that for convenience and clarity of description, specific working processes of the above described system, modules and units that are similar to corresponding processes in the above described method embodiments are omitted. It should be understood that the protection scopes of the present disclosure are not limited and those skilled in the art would readily think of various equivalent modifications or substitutions without departing from the protection scopes of the present disclosure.

What is claimed is:

1. A current detecting apparatus, characterized in comprising a current sensor, a microcontroller unit, a primary positive circuit and a primary negative circuit, wherein:
    a positive electrode of a power battery pack to be tested is connected to a first terminal of the primary positive circuit, a negative electrode of the power battery pack is connected to a first terminal of the primary negative circuit, and the current sensor is connected in series between the negative electrode of the power battery pack and the first terminal of the primary negative circuit;
    the current sensor is configured for obtaining and outputting a voltage signal of the power battery pack;
    the microcontroller unit is configured for collecting the voltage signal output from a signal terminal of the current sensor, implementing current conversion on the voltage signal, transmitting a detected current value, which is obtained by the current conversion, of the power battery pack and receiving a control command for controlling the primary positive circuit and the primary negative circuit to turn on or turn off;
    the primary positive circuit comprises a positive end MOS transistor unit and the primary negative circuit comprises a negative end MOS transistor unit;
    the positive end MOS transistor unit comprises one or more positive end MOS transistors connected in parallel, wherein a drain electrode of each positive end MOS transistor is connected to the first terminal of the primary positive circuit and a source electrode of each positive end MOS transistor is connected to a second terminal of the primary positive circuit;
    the primary positive circuit further comprises a primary positive end driving unit connected to a gate electrode of each positive end MOS transistor, wherein the primary positive end driving unit is configured for controlling the primary positive circuit to turn on or turn off by controlling the one or more positive end MOS transistors to turn on or turn off under the control of the control command;
    the negative end MOS transistor unit comprises one or more negative end MOS transistors connected in parallel, wherein a source electrode of each negative end MOS transistor is connected to the first terminal of the primary negative circuit and a drain electrode of each negative end MOS transistor is connected to a second terminal of the primary negative circuit; and
    the primary negative circuit further comprises a primary negative end driving unit connected to a gate electrode of each negative end MOS transistor, wherein the primary negative end driving unit is configured for controlling the primary negative circuit to turn on or turn off by controlling the one or more negative end MOS transistors to turn on or turn off under the control of the control command.

2. The current detecting apparatus of claim 1, characterized in further comprising an isolating and communicating module for:
    electrically isolating the current sensor, the microcontroller unit, the primary positive circuit and the primary negative circuit;
    receiving and forwarding the detected current value of the power battery pack; and
    receiving and forwarding the control command.

3. The current detecting apparatus of claim 1, characterized in further comprising a power isolating module for electrically isolating an input power supply and converting a voltage supplied by the electrically isolated power supply to voltages required by respective modules in the current detecting apparatus.

4. The current detecting apparatus of claim 1, characterized in that the current sensor is a shunt current sensor or a hall current sensor.

5. A battery management system characterized in comprising the current detecting apparatus of claim 1 and a battery management unit connected to the current detecting apparatus, wherein the battery management unit comprises:
    a memory storing computer instructions; and
    a processor, when executing the computer instructions, operable to:
    receive the detected current value, which is forwarded by the current detecting apparatus, of the power battery pack;
    when the positive end MOS transistor unit and the negative end MOS transistor unit in the current detecting apparatus are in a turn-on state, control the positive end MOS transistor unit and the negative end MOS transistor unit to turn off or turn on based on a preset maximum supply current value of the power battery pack and the detected current value.

6. The battery management system of claim 5, characterized in that the processor is further operable to, when both the positive end MOS transistor unit and the negative end MOS transistor unit in the current detecting apparatus are in the turn-on state:
    if a difference between the detected current value and the maximum supply current value is larger than a first preset difference threshold, then control both the positive end MOS transistor unit and the negative end MOS transistor unit to turn off;
    if the detected current value is larger than zero and less than the maximum supply current value, then control both the positive end MOS transistor unit and the negative end MOS transistor unit to turn on.

7. The battery management system of claim 5, characterized in that the processor is further operable to, when both the positive end MOS transistor unit and the negative end MOS transistor unit in the current detecting apparatus are in the turn-on state:

if the detected current value is equal to zero, then determine that the positive end MOS transistor unit, the negative end MOS transistor unit or a load module has an open circuit fault.

8. The battery management system of claim 5, characterized in that the processor is further operable to, when the positive end MOS transistor unit and the negative end MOS transistor unit in the current detecting apparatus are in a turn-off state:

if the detected current value is equal to zero, then control both the positive end MOS transistor unit and the negative end MOS transistor unit to turn off;

if a difference between the detected current value and the maximum supply current value is larger than a second preset difference threshold or the detected current value is larger than zero and less than the maximum supply current value, then determine that the positive end MOS transistor unit or the negative end MOS transistor unit has a short circuit fault.

9. The battery management system of claim 5, characterized in that the processor is further operable to:

generate a first control command for controlling both the positive end MOS transistor unit and the negative end MOS transistor unit to turn off;

generate a second control command for controlling both the positive end MOS transistor unit and the negative end MOS transistor unit to turn on.

10. The battery management system of claim 5, characterized in that the processor is further operable to:

if it is determined that the positive end MOS transistor unit has an open circuit fault or a short circuit fault or the negative end MOS transistor unit has the open circuit fault or the short circuit fault, then output an alert signal.

11. The battery management system of claim 9, characterized in that the battery management unit further comprises a power supply interface and a CAN communicating interface, wherein the power supply interface is configured for outputting a low-voltage direct-current power supply;

the CAN communicating interface is configured for connecting the current detecting apparatus and the battery management unit, transmitting the detected current value of the power battery pack, the first control command and the second control command.

* * * * *